(12) United States Patent
Chen et al.

(10) Patent No.: US 10,903,561 B2
(45) Date of Patent: Jan. 26, 2021

(54) SEMICONDUCTOR DEVICE PACKAGE AND METHOD OF MANUFACTURING THE SAME (71) Applicant: Advanced Semiconductor Engineering, Inc., Kaohsiung (TW)

(72) Inventors: Chien-Hua Chen, Kaohsiung (TW); Sheng-Chi Hsieh, Kaohsiung (TW); Chen-Chao Wang, Kaohsiung (TW); Teck-Chong Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 1 day.

(21) Appl. No.: 16/388,828

(22) Filed: Apr. 18, 2019

(65) Prior Publication Data
US 2020/0335858 A1  Oct. 22, 2020

(51) Int. Cl.
H01Q 1/38 (2006.01)
H01Q 23/00 (2006.01)
H01L 23/00 (2006.01)
H01L 23/538 (2006.01)
H01L 23/66 (2006.01)
H01L 23/31 (2006.01)
H01L 23/13 (2006.01)
H01L 23/552 (2006.01)
H01L 21/48 (2006.01)
H01L 21/56 (2006.01)
H01L 23/15 (2006.01)

(52) U.S. Cl.
CPC ............. H01Q 1/38 (2013.01); H01L 21/486 (2013.01); H01L 21/4857 (2013.01); H01L 21/56 (2013.01); H01L 23/13 (2013.01); H01L 23/15 (2013.01); H01L 23/3121 (2013.01); H01L 23/5383 (2013.01); H01L 23/5386 (2013.01); H01L 23/5389 (2013.01); H01L 23/552 (2013.01); H01L 23/66 (2013.01); H01L 24/19 (2013.01); H01Q 23/00 (2013.01); H01L 2223/6616 (2013.01); H01L 2223/6677 (2013.01); H01L 2224/211 (2013.01)

(58) Field of Classification Search
None
See application file for complete search history.

(56) References Cited

U.S. PATENT DOCUMENTS

| 9,172,131 | B2 | 10/2015 | Chen et al. | |
| 9,425,178 | B2* | 8/2016 | Lin | H01L 21/78 |
| 9,859,232 | B1* | 1/2018 | Chiang | H01L 23/3121 |
| 10,032,722 | B2* | 7/2018 | Yu | H01L 23/66 |

(Continued)

FOREIGN PATENT DOCUMENTS

CN    107437654 A    12/2017

Primary Examiner — Vibol Tan
(74) Attorney, Agent, or Firm — Foley & Lardner LLP (57) ABSTRACT A semiconductor device package includes a first glass carrier, a package body, a first circuit layer and a first antenna layer. The first circuit layer is disposed on the first surface of the first glass carrier. The first circuit layer has a redistribution layer (RDL). The package body is disposed on the first circuit layer. The package body has an interconnection structure penetrating the package body and is electrically connected to the RDL of the first circuit layer. The first antenna layer is disposed on the second surface of the first glass carrier.

19 Claims, 9 Drawing Sheets (56) References Cited

U.S. PATENT DOCUMENTS

| | | | |
|---|---|---|---|
| 10,186,492 B1* | 1/2019 | Wan | H01L 23/3135 |
| 10,475,775 B2* | 11/2019 | Fang | H01L 24/14 |
| 10,622,318 B2* | 4/2020 | Kim | H01L 23/49827 |
| 10,651,137 B2* | 5/2020 | Yu | H01L 23/3128 |
| 2017/0077039 A1* | 3/2017 | Liao | H01L 23/3121 |
| 2017/0207153 A1* | 7/2017 | Chang Chien | H01L 24/81 |
| 2017/0346185 A1 | 11/2017 | Wang et al. | |
| 2018/0191052 A1 | 7/2018 | Ndip et al. | |
| 2018/0358685 A1* | 12/2018 | Han | H01L 23/5389 |
| 2019/0319337 A1* | 10/2019 | Yen | H01L 21/486 |
| 2019/0334228 A1* | 10/2019 | Haridas | H01Q 21/0025 |
| 2020/0083591 A1* | 3/2020 | Hsieh | H01L 21/565 |

* cited by examiner

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly to a semiconductor device package including an antenna and a method of manufacturing the same.

2. Description of the Related Art

Wireless communication devices, such as cell phones, typically include antennas for transmitting and receiving radio frequency (RF) signals. Comparably, a wireless communication device includes an antenna and a communication module, each disposed on different parts of a circuit board. Under the comparable approach, the antenna and the communication module are separately manufactured and electrically connected together after being placed on the circuit board. Accordingly, separate manufacturing costs may be incurred for both components. Furthermore, it may be difficult to reduce a size of the wireless communication device to attain a suitably compact product design. To reduce the cost and package size, an Antenna-in-Package (AiP) approach is provided. In general, an organic substrate is used in an AiP system. However, due to the process constraint of the organic substrate, it is difficult to achieve fine-pitch (less than 15/15 μm), and the thickness of the organic substrate is relatively thick, which will hinder the miniaturization of the AiP system.

SUMMARY

In accordance with some embodiments of the present disclosure, a semiconductor device package includes a first glass carrier, a package body, a first circuit layer and a first antenna layer. The first circuit layer is disposed on the first surface of the first glass carrier. The first circuit layer has a redistribution layer (RDL). The package body is disposed on the first circuit layer. The package body has an interconnection structure penetrating the package body and is electrically connected to the RDL of the first circuit layer. The first antenna layer is disposed on the second surface of the first glass carrier.

In accordance with some embodiments of the present disclosure, a semiconductor device package includes a glass carrier, a first circuit layer, a first package body, a second package body and a first antenna. The glass carrier has a first surface and a second surface opposite to the first surface. The first circuit layer is disposed on the first surface of the glass carrier. The first circuit layer has a redistribution layer (RDL). The first package body is disposed on the first circuit layer. The first package body has an interconnection structure penetrating the first package body and electrically connected to the RDL. The second package body is disposed on the first package body. The second package body has an interconnection structure penetrating the second package body and electrically connected to the interconnection structure of the first package body. The first antenna layer is disposed on the second surface of the glass carrier.

In accordance with some embodiments of the present disclosure, a method of manufacturing a semiconductor device package includes (a) providing a first glass carrier having a first surface and a second surface opposite to the first surface; (b) forming a circuit layer having a redistribution layer (RDL) on the first surface of the first glass carrier; (c) forming a first package body on the circuit layer, the first package body having an interconnection structure penetrating the first package body and connected to the RDL of the circuit layer; (d) forming a first antenna layer on the second surface of the first glass carrier; (e) disposing an electronic component on the first package body and electrically connected to the interconnection structure of the first package body; and (f) forming a second package body on the first package body and encapsulating the electronic component.

Common reference numerals are used throughout the drawings and the detailed description to indicate the same or similar components. The present disclosure will be readily understood from the following detailed description taken in conjunction with the accompanying drawings.

DETAILED DESCRIPTION

Figure 1:
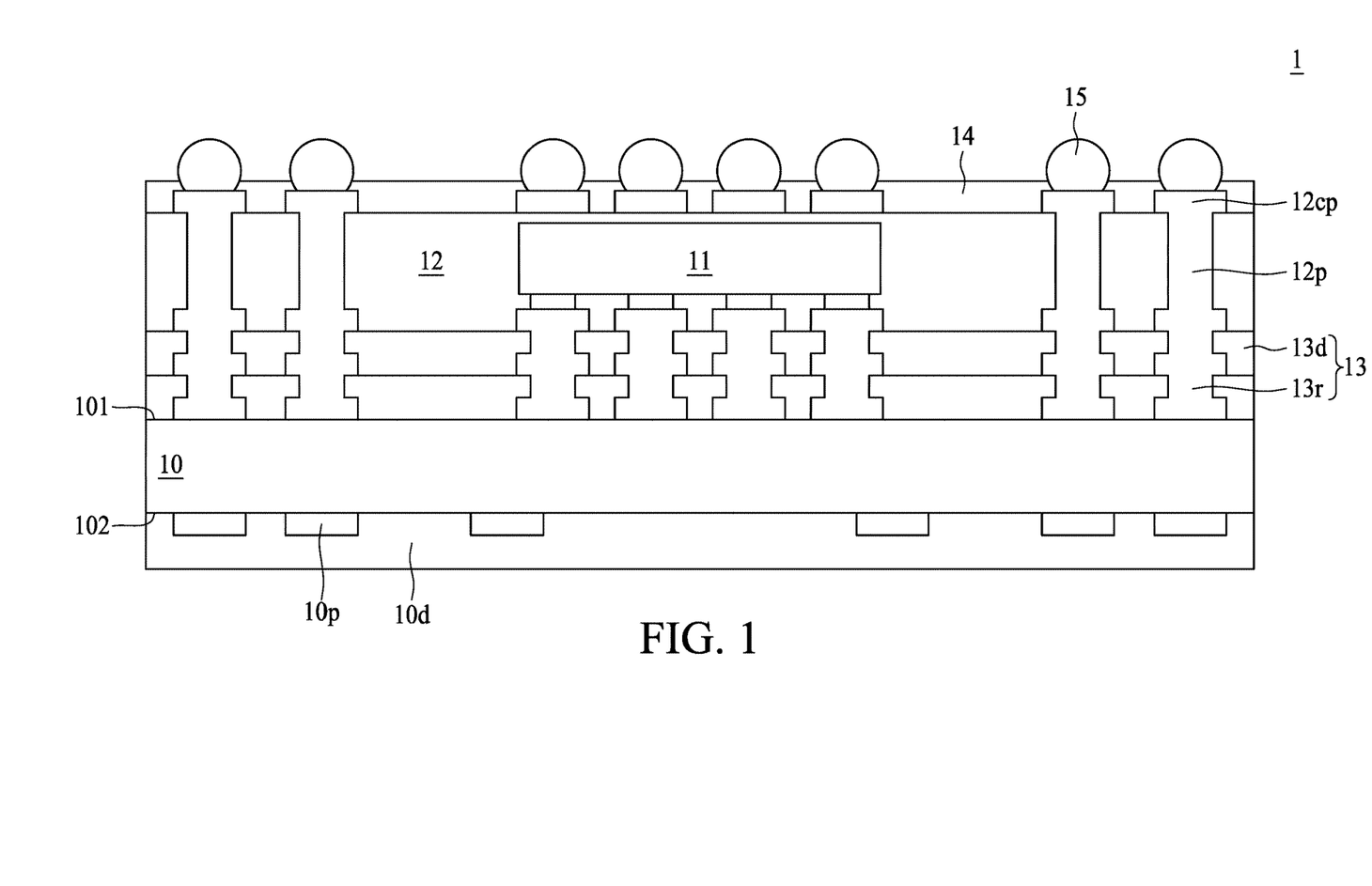
FIG. 1 illustrates a cross-sectional view of a semiconductor device package in accordance with some embodiments of the present disclosure.

FIG. 1 illustrates a cross-sectional view of a semiconductor device package 1 in accordance with some embodiments of the present disclosure. The semiconductor device package 1 includes a carrier 10, an electronic component 11, a package body 12, a circuit layer 13, a protection layer 14 and electrical contacts 15.

In some embodiments, the carrier 10 may be or include a glass substrate. The carrier 10 may include conductive pad(s), trace(s), and interconnection(s) (e.g. via(s)). In some embodiments, the carrier 10 may include transparent material. In some embodiments, the carrier 10 may include opaque material. The carrier 10 includes a material having a dielectric constant (Dk) less than approximately 3.5. The carrier 10 includes a material having a dielectric constant (Dk) less than approximately 3. The carrier 10 includes a material having a loss tangent or dissipation factor (Df) less than approximately 0.005. The carrier 10 includes a material having a loss tangent or dissipation factor (Df) less than approximately 0.003. The carrier 10 has a surface 101 and a surface 102 opposite to the surface 101. Compared to the organic substrate, it is easier to control the thickness of a glass carrier, which can facilitate the miniaturization of the semiconductor device package 1. In some embodiments, the thickness of the carrier 10 is about 400 μm.

A conductive layer 10p is disposed on the surface 102 of the carrier 10. In some embodiments, the conductive layer 10p defines a patterned antenna, such as a directional antenna, an omnidirectional antenna, an antenna array. For example, the conductive layer 10p defines a patch antenna. The conductive layer 10p is, or includes, a conductive material such as a metal or metal alloy. Examples of the conductive material include gold (Au), silver (Ag), copper (Cu), platinum (Pt), Palladium (Pd), other metal(s) or alloy(s), or a combination of two or more thereof.

In some embodiments, a dielectric layer 10d is disposed on the surface 102 of the carrier 10 to cover the conductive layer 10p. In some embodiments, the dielectric layer 10d may include pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of a pre-preg may include, but are not limited to, a multi-layer structure formed by stacking or laminating a number of pre-impregnated materials/sheets.

The circuit layer 13 is disposed on the surface 101 of the carrier 10. The circuit layer 13 includes one or more interconnection layers (e.g., redistribution layers, RDLs) 13r and one or more dielectric layers 13d. A portion of the interconnection layer 13r is covered or encapsulated by the dielectric layer 13d while another portion of the interconnection layer 13r is exposed from the dielectric layer 13d to provide electrical connections. The exposed portion of the interconnection layer 13r is electrically connected to the interconnection structure 12p and the active surface of the electronic component 11. In some embodiments, a portion of the interconnection layer 13r of the circuit layer 13 directly disposed on the surface 101 of the carrier 10 may define an antenna.

In some embodiments, the dielectric layer 13d may include pre-impregnated composite fibers (e.g., pre-preg), BPSG, silicon oxide, silicon nitride, silicon oxynitride, USG, any combination of two or more thereof, or the like. Examples of a pre-preg may include, but are not limited to, a multi-layer structure formed by stacking or laminating a number of pre-impregnated materials/sheets. In some embodiments, there may be any number of interconnection layers 13r depending on design specifications. In some embodiments, the interconnection layer 13r is formed of or includes Au, Ag, Cu, Pt, Pd, or an alloy thereof.

The electronic component 11 is disposed on the circuit layer 13 and electrically connected to the interconnection layer 13r exposed from the dielectric layer 13d. The electronic component 11 may be an active electronic component, such as an integrated circuit (IC) chip or a die. The electronic component 11 has an active surface bonded or connected to the interconnection layer 13r exposed from the dielectric layer 13d.

One or more interconnection structure 12p (e.g., conductive pillars or conductive elements) are disposed on the circuit layer 13 and electrically connected to the interconnection layer 13r exposed from the dielectric layer 13d. In some embodiments, the interconnection structure 12p is electrically connected to the interconnection layer 13r to define a dipole antenna. The interconnection structure 12p is, or includes, a conductive material such as a metal or metal alloy. Examples of the conductive material include Au, Ag, Cu, Pt, Pd, or an alloy thereof.

The package body 12 is disposed on the circuit layer 13. The package body 12 covers the electronic component 11 and the interconnection structure 12p. In some embodiments, a backside surface of the electronic component 11 is fully covered by the package body 12. In other embodiments, the backside surface of the electronic component 11 may be exposed from the package body 12. The package body 12 covers a portion of the interconnect structure 12p and expose another portion (e.g., top portion) of the interconnection structure 12p for electrical connections. In some embodiments, the package body 12 includes an epoxy resin including fillers, a molding compound (e.g., an epoxy molding compound or other molding compound), a polyimide, a phenolic compound or material, a material including a silicone dispersed therein, or a combination thereof.

A conductive layer 12cp is disposed on the package body 12. A portion of the conductive layer 12cp is electrically connected to the exposed portion of the interconnection structure 12p.

The protection layer 14 is disposed on the package body 12 to cover a portion of the conductive layer 12cp and exposes another portion of the conductive layer 12cp for electrical connections. In some embodiments, the protection layer 14 may be or includes solder mask or other suitable materials.

The electrical contacts 15 are disposed on the conductive layer 12cp exposed from the protection layer 14. In some embodiments, the electrical contacts 15 may include solder or other suitable material(s).

Figure 2:
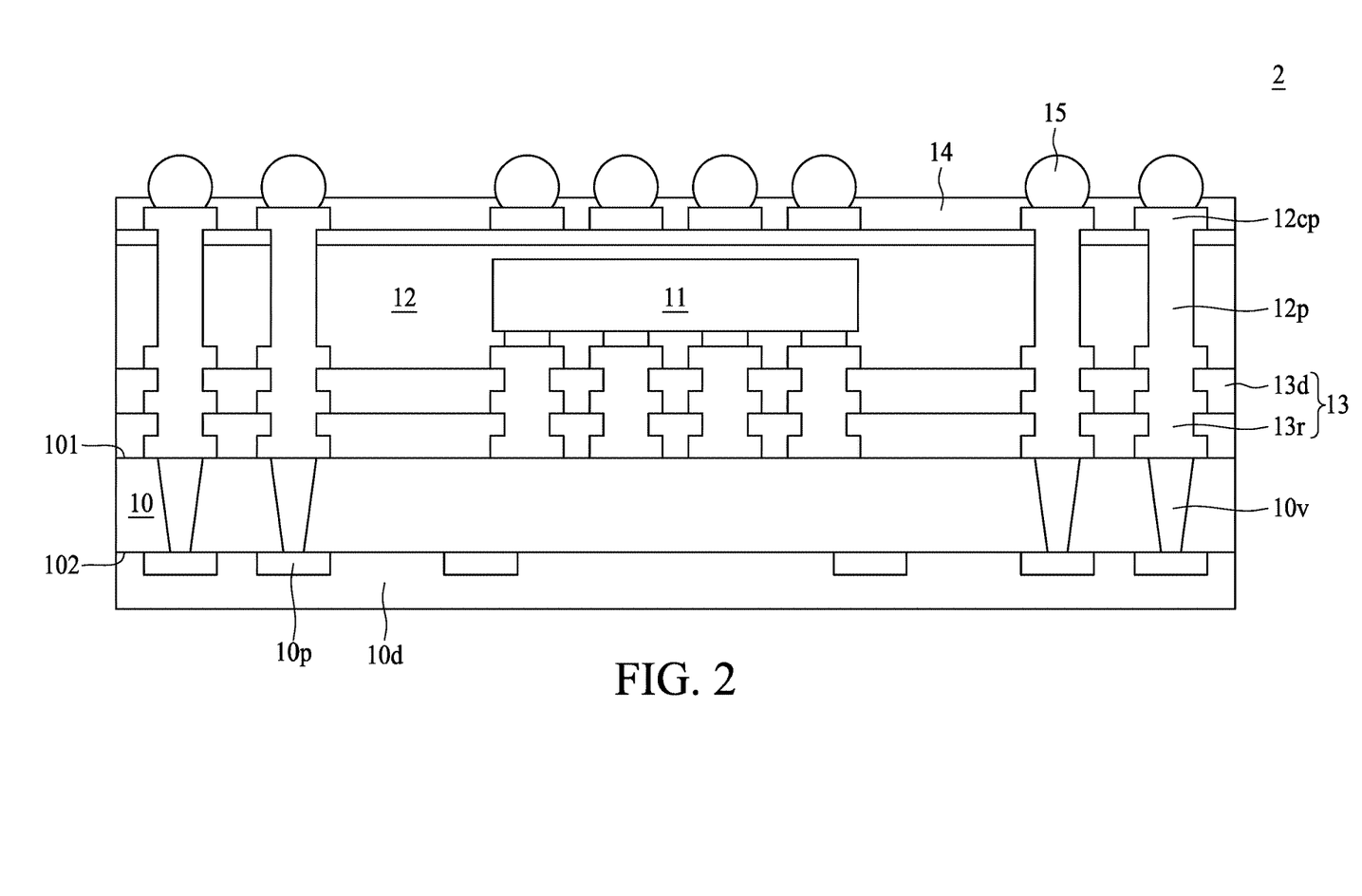
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1 in FIG. 1, and the difference therebetween are described below.

The semiconductor device package 2 includes one or more conductive elements 10v (e.g., through vias) penetrating the carrier 10 to electrically connect the interconnection layer 13r with the conductive layer 10p. In some embodiments, the conductive element 10v may define an antenna, such as a dipole antenna.

Figure 3:
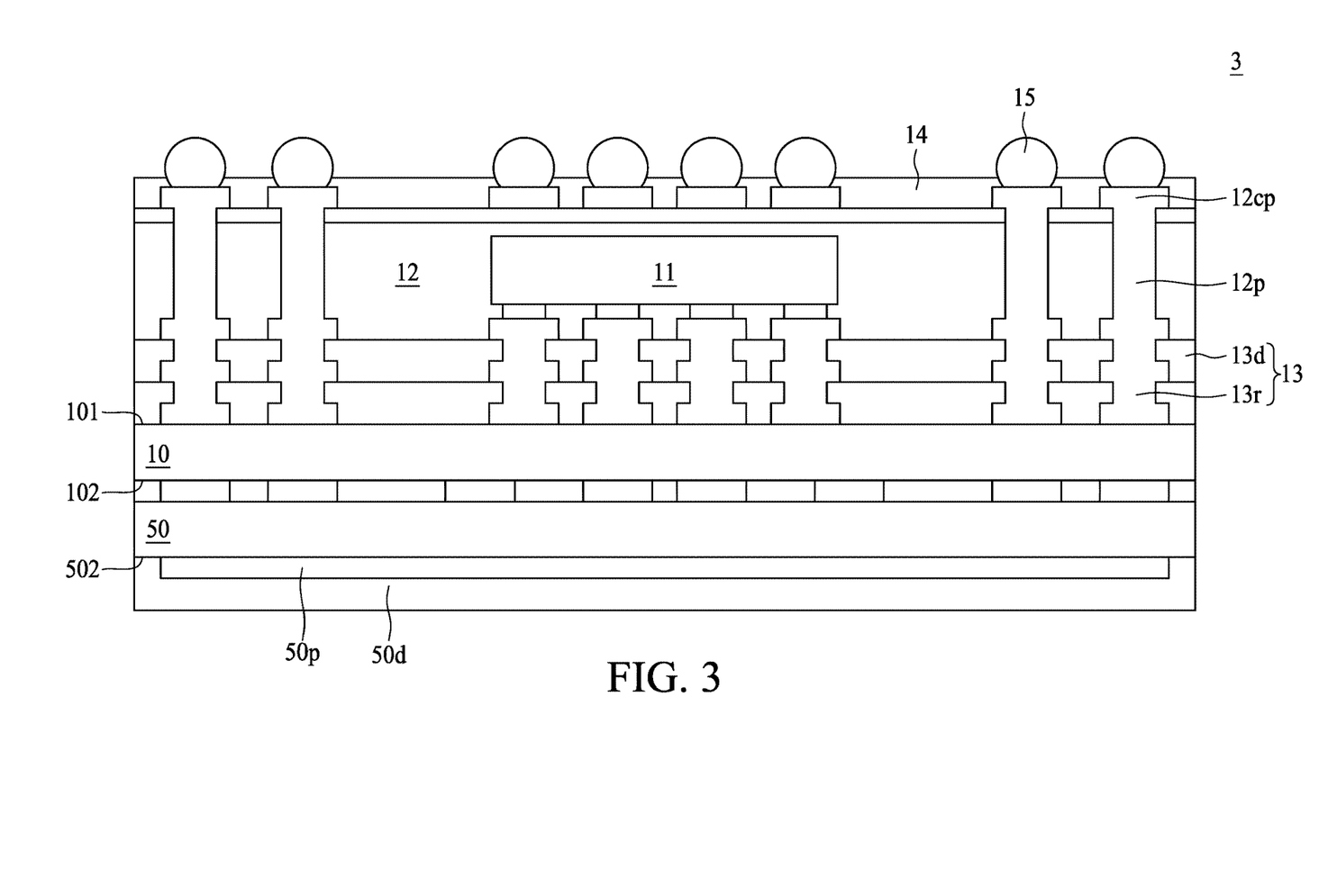
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 1 in FIG. 1, and the difference therebetween are described below.

A carrier 50 is disposed on the surface 102 of the carrier 10. The carrier 50 is in contact with the conductive layer 10p on the surface 102 of the carrier 10. In some embodiments, the carrier 50 includes a glass plate. A conductive layer 50p is disposed on a surface 502 of the carrier 50. In some embodiments, the conductive layer 50p may define an antenna, such as a patch antenna. In some embodiments, the conductive layer 50p may be coupled to the conductive layer 10p for signal transmission.

A dielectric layer 50d is disposed on the surface 502 of the carrier 50 to cover the conductive layer 50p. In some embodiments, the carrier 50 may be a portion of an electronic device including the semiconductor device package 3. For example, the carrier 50 may be a back cover of a mobile device, a tablet or a notebook. In some embodiments, the dielectric layer 50d may include pre-impregnated composite fibers (e.g., pre-preg), BPSG, silicon oxide, silicon nitride, silicon oxynitride, USG, any combination of two or more thereof, or the like. Examples of a pre-preg may include, but are not limited to, a multi-layer structure formed by stacking or laminating a number of pre-impregnated materials/sheets.

Figure 4:
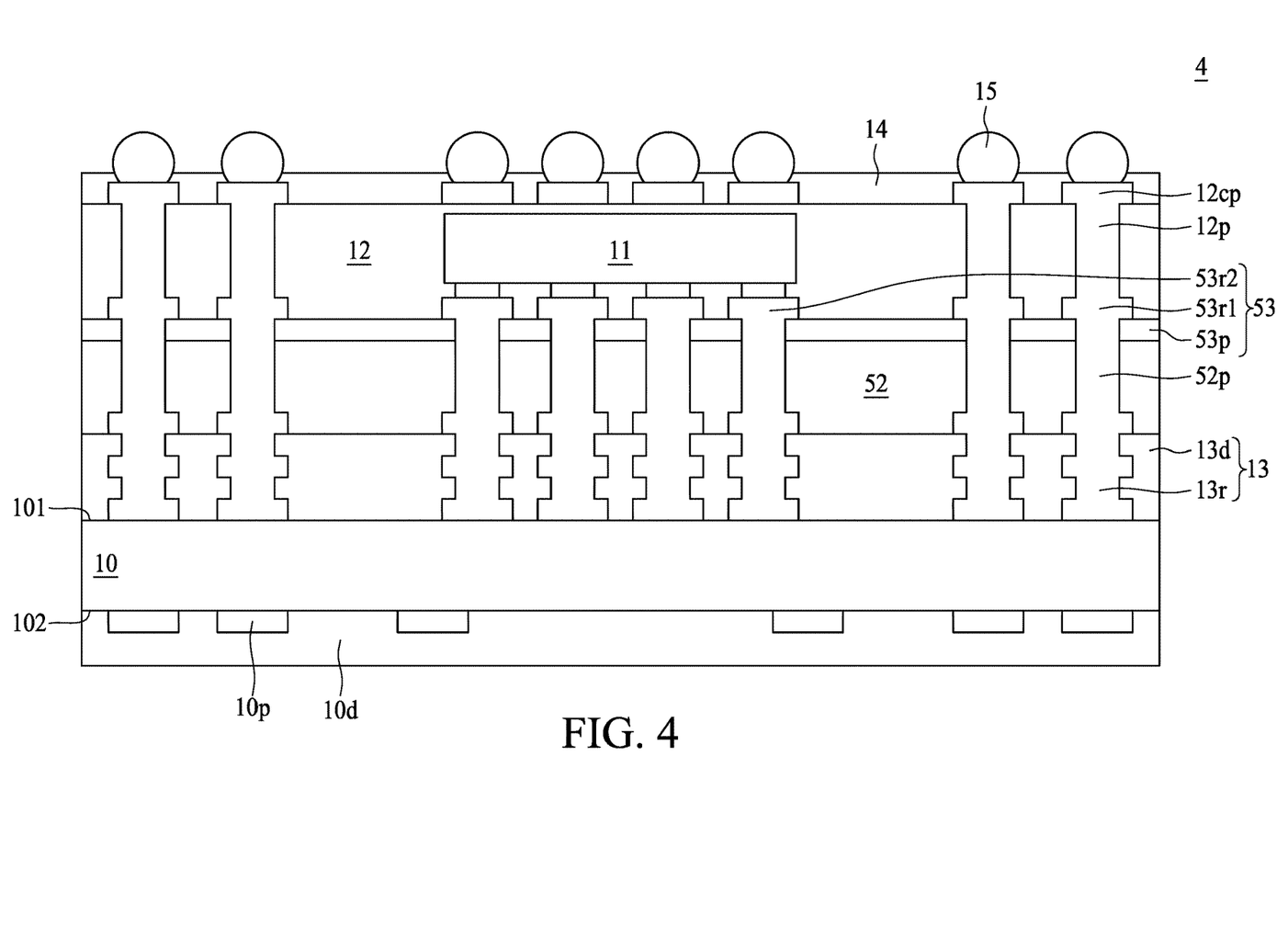
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 is similar to the semiconductor device package 1 in FIG. 1, and the difference therebetween are described below.

The semiconductor device package further includes package body 52 disposed between the circuit layer 13 and the package body 12. One or more interconnection structure 52p (e.g., conductive pillars or conductive elements) are disposed on the circuit layer 13 and penetrate the package body 52 to electrically connect to the interconnection layer 13r of the circuit layer 13. The interconnection structure 52p is, or includes, a conductive material such as a metal or metal alloy. Examples of the conductive material include Au, Ag, Cu, Pt, Pd, or an alloy thereof. In some embodiments, a ratio of the thickness of the package body 52 to the thickness of the carrier 10 is about 1:2. In some embodiments, the thickness of the package body 52 is about 200 micrometer (μm), and the thickness of the carrier 10 is about 400 μm.

A conductive layer 53 is disposed on the package body 52. The conductive layer 53 includes interconnection layers 53r1, 53r2 and a passivation layer 53p. The interconnection layers 53r1 and 53r2 are disposed on a surface (which is in contact with the package body 12) of the passivation layer 53p and covered by the package body 12. In some embodiments, the interconnection layer 53r1 is electrically connected to the interconnection structure 52p and the interconnection structure 12p. The interconnection layer 53r2 is electrically connected to the interconnection structure 52p and conductive terminals (e.g., conductive pillars) of an active surface of the electronic component 11. In some embodiments, the passivation layer 53p includes silicon oxide, silicon nitride, gallium oxide, aluminum oxide, scandium oxide, zirconium oxide, lanthanum oxide or hafnium oxide. The interconnection layers 53r1 and 53r2 are, or include, a conductive material such as a metal or metal alloy. Examples of the conductive material include Au, Ag, Cu, Pt, Pd, or an alloy thereof.

In accordance with the embodiments in FIG. 4, the electronic component 11 is spaced apart from the antenna structure (e.g., the conductive layer 10p and/or a portion of the interconnection layer 13r in contact with the surface 101 of the carrier 10) by the package body 52, which can prevent the interference between the electronic component 11 and the antenna, and the performance of the semiconductor device package 10 can be improved.

FIG. 5A, FIG. 5B, FIG. 5C, FIG. 5D and FIG. 5E illustrate a semiconductor manufacturing method in accordance with some embodiments of the present disclosure. In some embodiments, the method in FIG. 5A, FIG. 5B, FIG. 5C, FIG. 5D and FIG. 5E can be used to manufacture the semiconductor device package 4 in FIG. 4.

Figure 5A:
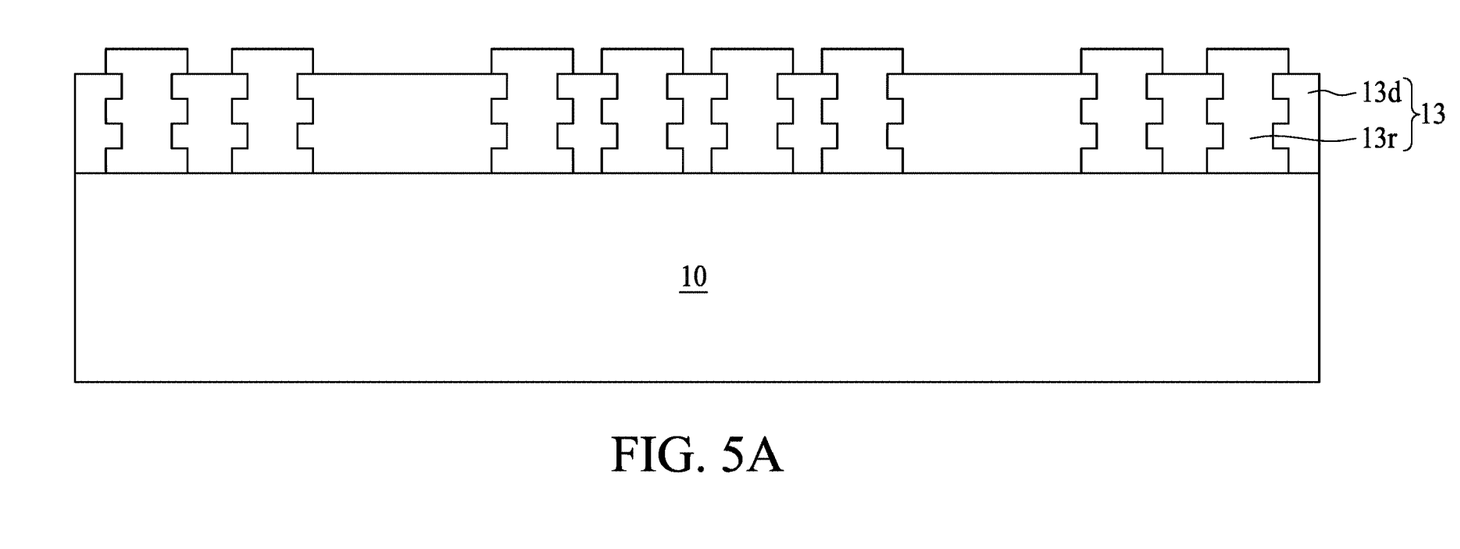
FIG. 5A, FIG. 5B, FIG. 5C, FIG. 5D and FIG. 5E illustrate a semiconductor manufacturing method in accordance with some embodiments of the present disclosure.

Referring to FIG. 5A, a carrier 10 is provided. A circuit layer 13 (e.g., RDL structure), which may include a dielectric layer 13d and an interconnection layer 13r, is formed on the carrier 10. The dielectric layer 13d is formed by, for example but is not limited to, photolithographic technique. The interconnection layer 13r is formed by, for example but is not limited to, plating technique.

Figure 5B:
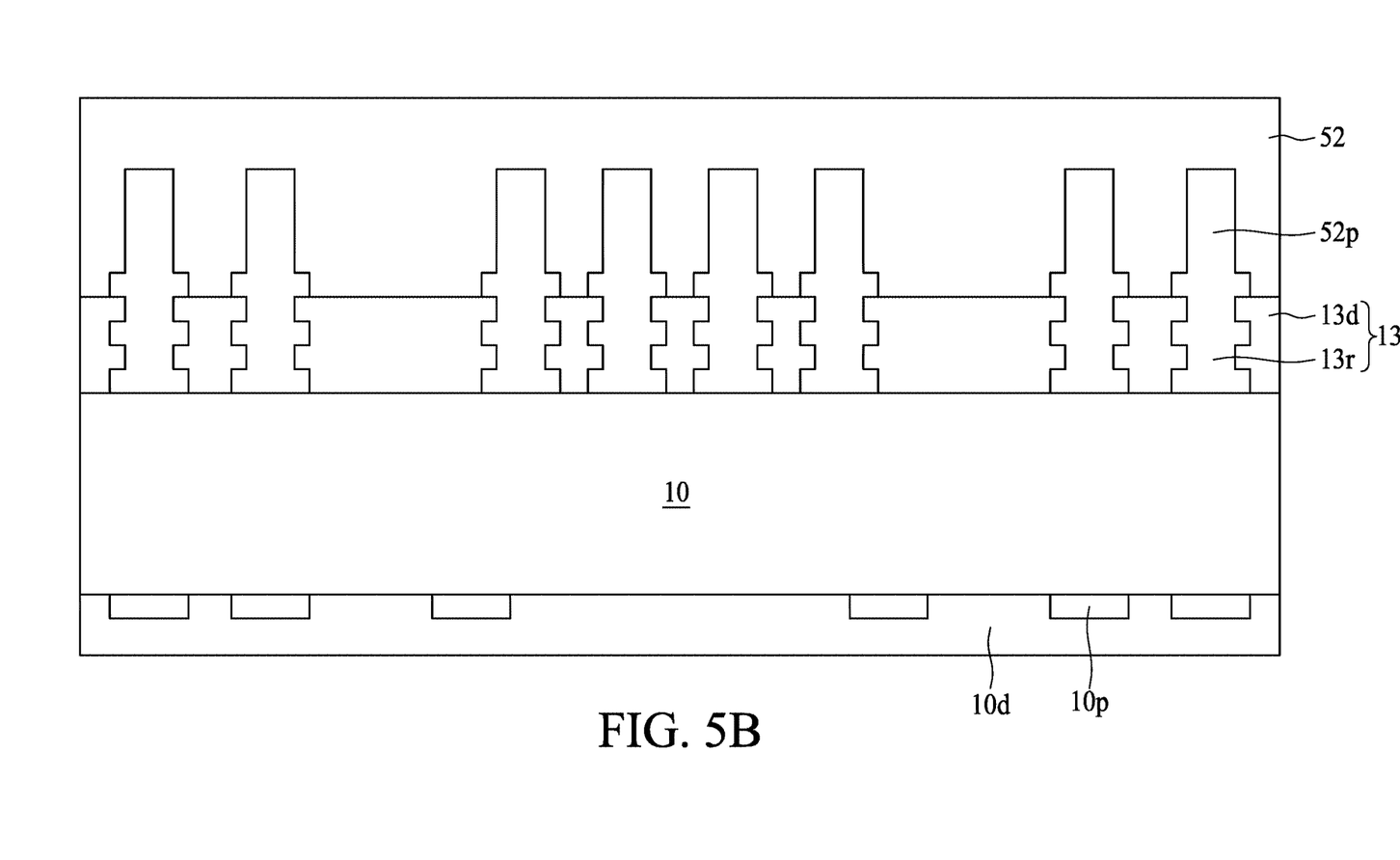

Referring to FIG. 5B, the interconnection structure 52p is formed on the circuit layer 13 to electrically connect to interconnection layer 13r exposed from the dielectric layer 13d. In some embodiments, the interconnection structure 52p is formed by, for example but is not limited to, plating technique. A package body 52 is formed to encapsulate the interconnection structure 52p.

A portion of the carrier 10 as shown in FIG. 5B is removed from the lower side or bottom side by, for example but is not limited to, grinding technique. The conductive layer 10p (e.g., patterned antenna) is formed on thinned or grinded carrier 10, and the dielectric layer 10d is formed to cover the conductive layer 10p. In some embodiments, the carrier 10 may include glass, which may facilitate alignment between the conductive layer 10p and the interconnection layer 13r. In some embodiments, the carrier 10 may include glass, which may mitigate warpage issue which may occur in various manufacturing stages.

Figure 5C:
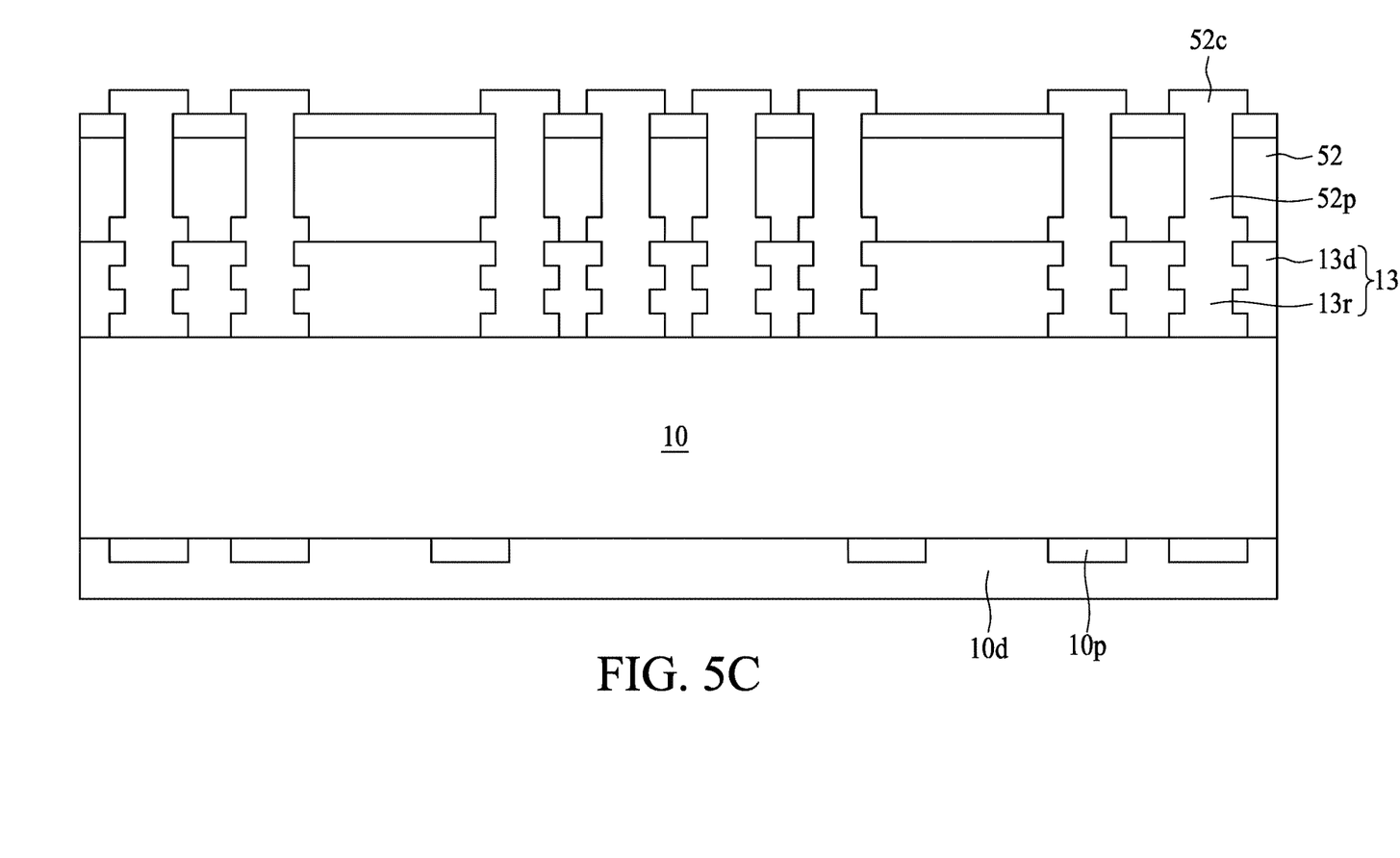

Referring to FIG. 5C, part of the package body 52 is removed to expose the interconnection structure 52p. In some embodiments, a conductive layer 52c may be formed on the interconnection structure 52p exposed from the package body 52.

Figure 5D:
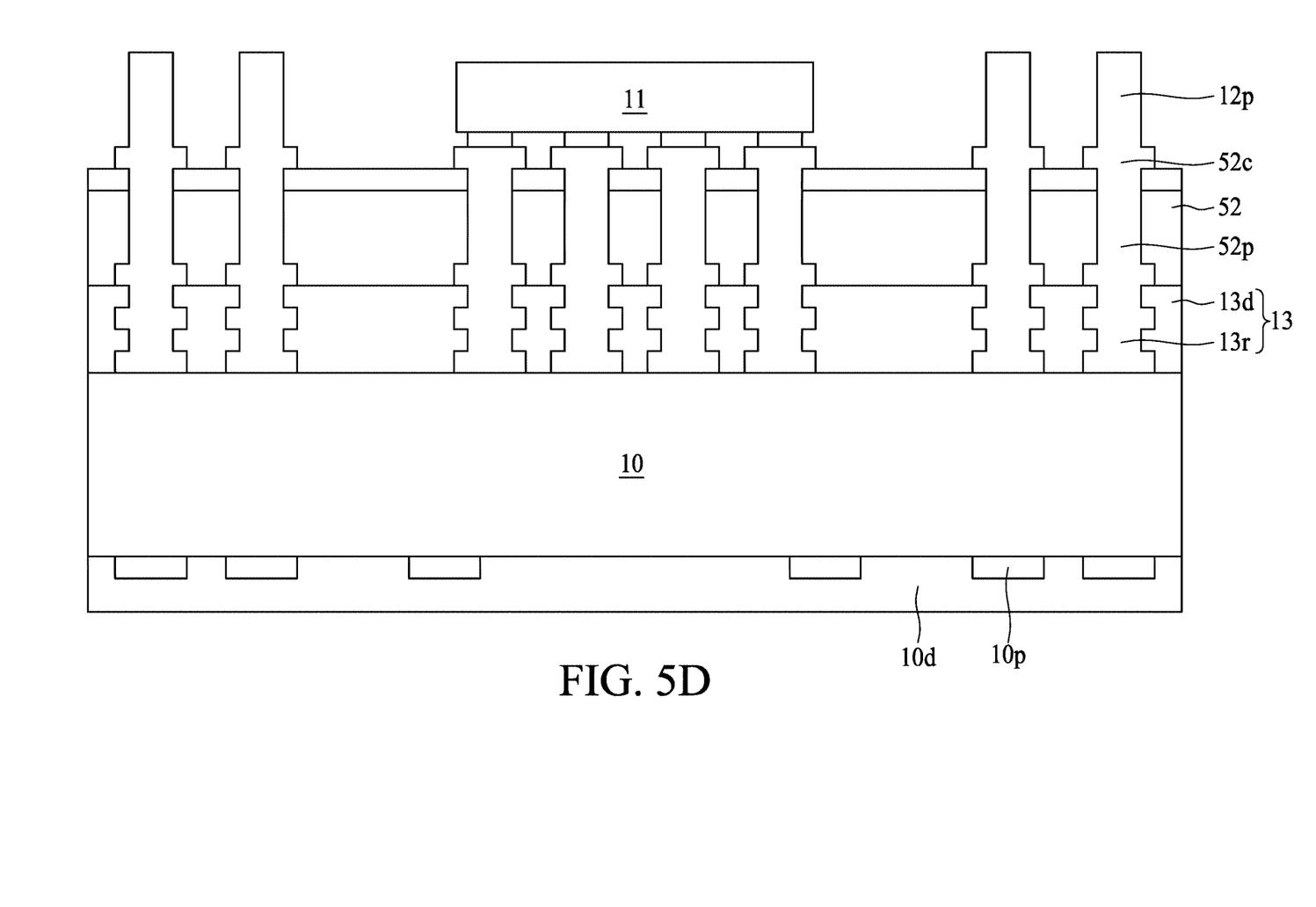

Referring to FIG. 5D, the interconnection structure 12p is formed on the package body 52 and electrically connected to the interconnection structure 52p through the conductive layer 52c. The electronic component 11 is attached or bonded to the interconnection structure 52p through the conductive layer 52c.

Figure 5E:
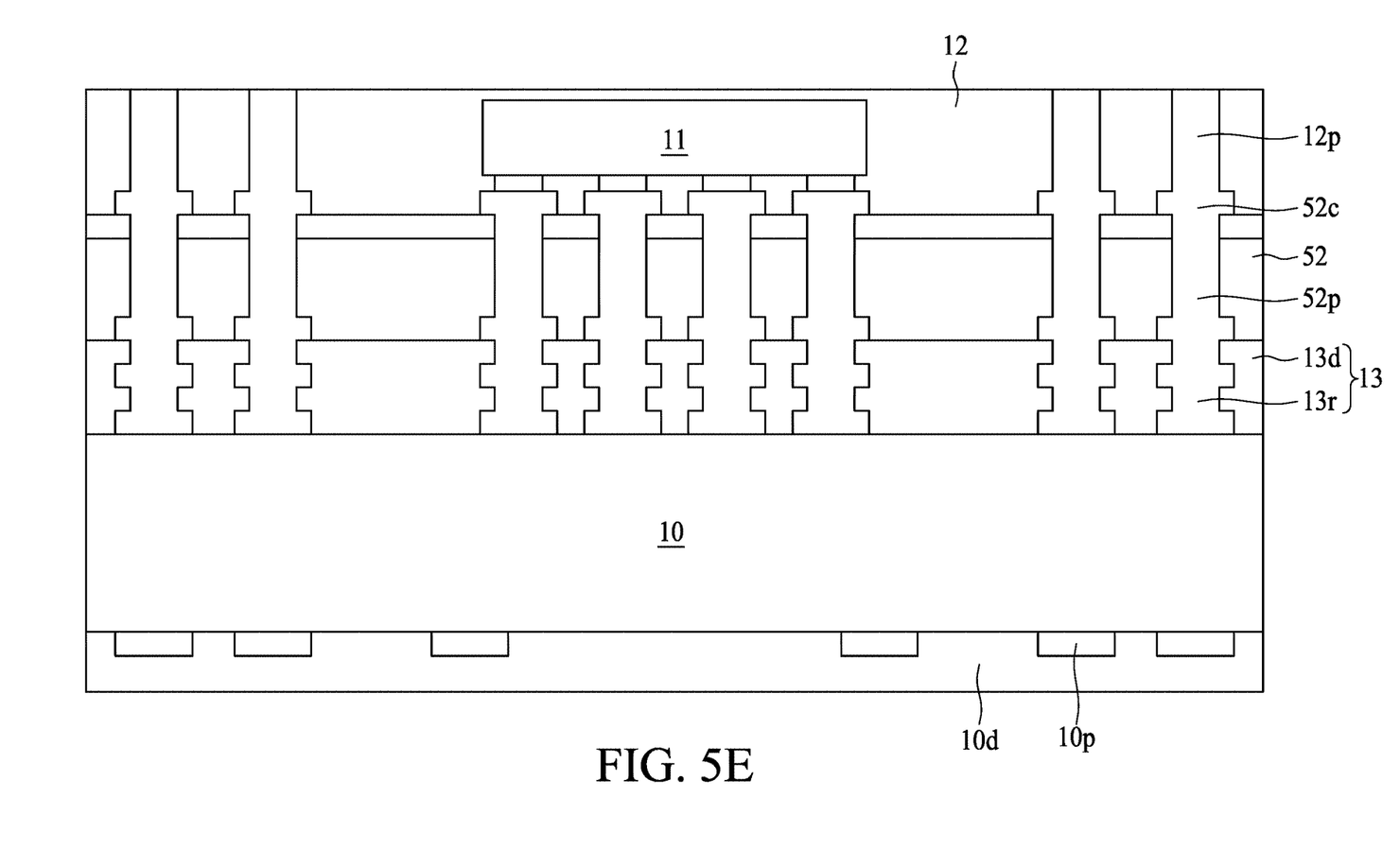

Referring to FIG. 5E, the package body 12 is formed to encapsulate the interconnection structure 12p and the electronic component 11. The package body 12 may include a molding compound material. In some embodiments, the package body 12 is formed to fully encapsulate the interconnection structure 12p and the electronic component 11, and then a portion of the package body 12 is removed by, for example, grinding to expose a top portion of the interconnection structure 12p.

In some embodiments, the conductive layer 12cp is formed on the package body 12 and electrically connected to the exposed portion of the interconnection structure 12p. The protection layer 14 is formed on the package body 12 and exposes a portion of the conductive layer 12cp. Electrical contacts 15 are then formed on the exposed portion of the conductive layer 12cp to form the semiconductor device package 4 as shown in FIG. 4.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within within 10 or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
    a first glass carrier having a first surface and a second surface opposite to the first surface;
    a first circuit layer disposed on the first surface of the first glass carrier, the first circuit layer having a redistribution layer (RDL);
    a package body disposed on the first circuit layer, the package body having an interconnection structure penetrating the package body and electrically connected to the RDL of the first circuit layer;
    a first antenna layer disposed on the second surface of the first glass carrier; and
    a through via penetrating the first glass carrier and electrically connecting the RDL of the first circuit layer to the first antenna layer.

2. The semiconductor device package of claim 1, further comprising an electronic component disposed on the first circuit layer wherein the electronic component has an active surface facing the first circuit layer and electrically connected to the RDL of the first circuit layer.

3. The semiconductor device package of claim 2, wherein the electronic component is encapsulated by the package body.

4. The semiconductor device package of claim 1, wherein the RDL of the first circuit layer and the interconnection structure of the package body define a dipole antenna.

5. The semiconductor device package of claim 1, further comprising:
    a second glass carrier disposed on the first antenna layer; and
    a second antenna layer disposed on a surface of the second glass carrier facing away from the first glass carrier.

6. A semiconductor device package, comprising:
    a glass carrier having a first surface and a second surface opposite to the first surface;
    a first circuit layer disposed on the first surface of the glass carrier, the first circuit layer having a redistribution layer (RDL);
    a first package body disposed on the first circuit layer, the first package body having an interconnection structure penetrating the first package body and electrically connected to the RDL;
    a second package body disposed on the first package body, the second package body having an interconnection structure penetrating the second package body and electrically connected to the interconnection structure of the first package body; and
    a first antenna layer disposed on the second surface of the glass carrier.

7. The semiconductor device package of claim 6, further comprising an electronic component disposed on the first package body and electrically connected to the interconnection structure of the first package body, wherein the electronic component has an active surface facing the first circuit layer.

8. The semiconductor device package of claim 7, wherein the electronic component is encapsulated by the second package body.

9. The semiconductor device package of claim 7, further comprising a second circuit layer disposed between the first package body and the second package body, wherein the second circuit layer has a RDL electrically connected to the interconnection structure of the first package body and the interconnection structure of the second package body.

10. The semiconductor device package of claim 6, wherein a thickness of the first package body is equal to or greater than 200 μm.

11. A method of manufacturing a semiconductor device, the method comprising:
    (a) providing a first glass carrier having a first surface and a second surface opposite to the first surface;
    (b) forming a circuit layer having a redistribution layer (RDL) on the first surface of the first glass carrier;
    (c) forming a first package body on the circuit layer, the first package body having an interconnection structure penetrating the first package body and connected to the RDL of the circuit layer;
    (d) forming a first antenna layer on the second surface of the first glass carrier;
    (e) disposing an electronic component on the first package body and electrically connected to the interconnection structure of the first package body; and
    (f) forming a second package body on the first package body and encapsulating the electronic component.

12. The method of claim 11, before operation (d), further comprising removing a portion of the first glass carrier to thin the first glass carrier.

13. The method of claim 11, wherein operation (c) further comprises:
- disposing one or more conductive pillars on the circuit layer and electrically connected to the RDL of the circuit layer;
- forming the first package body on the circuit layer to encapsulate the conductive pillars; and
- removing a portion of the first package body to expose the conductive pillars.

14. The method of claim 11, after operation (e), further comprising:
- disposing on or more conductive pillars on the first package body and electrically connected to the interconnection structure of the first package body;
- forming the second package body on the first package body to encapsulate the conductive pillars; and
- removing a portion of the second package body to expose the conductive pillars.

15. The method of claim 11, wherein a thickness of the first glass carrier is equal to or greater than 400 μm.

16. The method of claim 11, wherein a thickness of the first package body is equal to or greater than 200 μm.

17. The method of claim 11, further comprising forming a second glass carrier on the first antenna layer.

18. The semiconductor device package of claim 6, wherein a ratio of a thickness of the first package body to the thickness of the glass carrier is about 1:2.

19. The method of claim 17, further comprising forming a second antenna layer on a surface of the second glass carrier facing away from the first glass carrier.

* * * * *